United States Patent [19]

Rogers, Jr. et al.

[11] Patent Number: 4,590,091
[45] Date of Patent: May 20, 1986

[54] PHOTOCHEMICAL PROCESS FOR SUBSTRATE SURFACE PREPARATION

[75] Inventors: Harvey N. Rogers, Jr., Los Angeles; James T. Hall, Redondo Beach, both of Calif.

[73] Assignee: Hughes Aircraft Company, Los Angeles, Calif.

[21] Appl. No.: 682,406

[22] Filed: Dec. 17, 1984

[51] Int. Cl.$^4$ .................... B05D 3/06; B05D 5/12; C23C 13/00

[52] U.S. Cl. .................. 427/53.1; 427/54.1; 427/82; 427/86; 427/226; 427/248.1; 427/255; 427/307

[58] Field of Search .............. 427/54.1, 53.1, 86, 427/82, 248.1, 255, 226, 307; 204/157.1 R

[56] References Cited

U.S. PATENT DOCUMENTS

| | | | |
|---|---|---|---|
| 4,265,932 | 5/1981 | Peters et al. | 427/53.1 |
| 4,341,818 | 7/1982 | Adams et al. | 427/248.1 X |
| 4,371,587 | 2/1983 | Peters | 427/53.1 X |
| 4,434,189 | 2/1984 | Zaplatynsky | 427/53.1 |
| 4,435,445 | 3/1984 | Allred et al. | 427/54.1 |
| 4,448,801 | 5/1984 | Fukuda et al. | 427/53.1 X |
| 4,474,829 | 10/1984 | Peters | 427/53.1 |

OTHER PUBLICATIONS

F. J. Ryan et al., "Reduction of HgCdTe Surfaces Using In-Situ Atomic Hydrogenation", Extended Abstract of the 1983 U.S. Workshop on Physics and Chemistry of HgCdTe, (Feb. 8–10, 1983).

D.J. Ehrlich, et al., "Laser-Induced Photochemical Reactions for Electronic Device Fabrication," Laser and Electron Beam processing of materials, Part XI: Device applications, Academic Press, Inc., 1980, pp. 671–677.

Primary Examiner—Thurman K. Page
Attorney, Agent, or Firm—Mary E. Lachman; A. W. Karambelas

[57] ABSTRACT

A substrate having an undesired native oxide layer formed on the surface thereof is treated at a low temperature by exposure to a chosen vapor phase hydrogen-containing precursor in the presence of radiation of a selected wavelength. Upon radiation-inducement, neutral hydrogen species are formed from the precursor and interact with the native oxide to convert the native oxide to a chemically reduced form. By this process, thermal damage and charge damage to the substrate are avoided and the electrical properties of a subsequently formed device are enhanced.

9 Claims, No Drawings

PHOTOCHEMICAL PROCESS FOR SUBSTRATE SURFACE PREPARATION

The Government of the United States of America has rights in this invention pursuant to Contract No. F33615-79-C-5055 awarded by the Department of the Air Force.

BACKGROUND OF THE INVENTION

1. Field of the Invention

The present invention relates generally to the manufacture of semiconductor devices and, more particularly, to a process for treating the surface of a selected semiconductor substrate having a native oxide layer formed on the surface thereof.

2. Description of the Background Art

In the fabrication of certain semiconductor devices using substrates formed of compound semiconductor materials, such as mercury cadmium telluride, gallium arsenide, indium phosphide, as well as some elemental materials, such as germanium, the presence of native oxide contamination or organic contamination on the substrate surface frequently degrades device performance. In a device in which an insulator layer is deposited on the substrate surface, the presence of the intervening native oxide layer may interfere with optimum electrical performance at the semiconductor/insulator interface. In particular, the device may exhibit degraded current-voltage or capacitance-voltage characteristics, degraded electron transport behavior in the semiconductor material, charge leaks, charge traps, or degraded switching characteristics in the device. Thus, it is advantageous to remove the native oxide layer from the substrate surface prior to the deposition of an insulator layer on this surface.

Known methods for removing native oxide layers and organic surface contamination include both in-situ methods in which the native oxide layer is removed in the same reaction chamber in which the insulator layer is subsequently deposited, and ex-situ methods in which the native oxide layer is removed at a location external to the reaction chamber for insulator layer deposition. Ex-situ methods include treating the substrate surface with various wet acid solutions, such as hydrochloric acid, at elevated temperatures or rinsing with solvents, such as methanol. These ex-situ methods have the major disadvantage that the treated semiconductor surface is vulnerable to contamination in the time period after cleaning and before the insulator layer is deposited. One in-situ method which overcomes the latter problem uses a radio frequency (rf) discharge to generate a plasma of reactive particles, such as atomic hydrogen, that interact with the substrate surface. The latter method is described by F. Capasso and G. F. Williams in the publication entitled "A Proposed Hydrogenation/Nitridization Passivation Mechanism for GaAs and Other III-V Semiconductor Devices, Including InGaAs Long Wavelength Photodetectors", *Journal of the Electrochemical Society: Solid State Science and Technology*, Vol. 129, No. 4, April 1982, pages 821-824. The disadvantage of using a plasma discharge method for substrate surface preparation is that numerous ionized and neutral particles, as well as high energy radiation are produced and bombard the substrate surface. If the substrate comprises a sensitive device type, such as a device formed of certain compound semiconductor materials (e.g. HgCdTe, InSb, or GaAs), the charged particles and radiation frequently damage these devices. In addition, plasma processing can produce thermal damage to the substrate due to selective absorption of radiation by the substrate and the resultant heating of the substrate. This heating may be sufficient to cause out-diffusion of one or more constituent elements of a compound semiconductor substrate, such as mercury in mercury cadmium telluride.

Thus, the need exists for a low-temperature, charge-free process for minimizing the native oxide layer on the surface of a substrate.

SUMMARY OF THE INVENTION

The general purpose of the present invention is to provide a new and improved process for treating the surface of a substrate having an unwanted native oxide layer formed thereon, by a low-temperature, charge-free process. This process possesses most, if not all, of the advantages of the prior art processes while overcoming their above mentioned significant disadvantages.

The above described general purpose of this invention is accomplished by exposing the substrate, having a native oxide layer formed thereon, at a predetermined temperature to a chosen vapor phase hydrogen-containing precursor in the presence of radiation of a selected wavelength. Upon radiation-inducement, neutral hydrogen species are formed from the precursor and interact with the native oxide to convert the native oxide to a chemically reduced form. By this process, thermal damage and charge damage to the substrate are avoided.

Accordingly, it is a specific purpose of the present invention to provide a low-temperature process for chemically reducing the native oxide layer on the surface of a substrate without producing thermal damage to the substrate.

Another purpose is to provide a process of the type described above, in which charge-damage and radiation-damage to the substrate are avoided.

Yet another purpose is to provide a process for treating the surface of a selected semiconductor substrate prior to the deposition of an insulator layer thereon, in order to enhance the electrical properties at the interface between the semiconductor surface and the insulator.

A further purpose of the present invention is to provide an in-situ process for treating the surface of a semiconductor substrate and for immediately following the substrate surface treatment with an insulator deposition process in the same reaction chamber.

The above described and many other features and attendant advantages of the present invention will become better understood by reference to the following detailed description of the invention.

DETAILED DESCRIPTION OF THE INVENTION

In accordance with the process of the present invention, a semiconductor substrate having a layer of native oxide formed on the surface thereof is exposed to a hydrogen-containing precursor and radiation of a selected wavelength. The radiation produces dissociation of the hydrogen-containing precursor to form neutral hydrogen species which interact with the native oxide layer to produce a chemically reduced form of the oxide. While not limiting the present invention to a particular theory of operation, it is believed that the hydrogen species may produce either an etching effect or a reduction effect or both, with the result being a reduction in the oxygen content of the substrate surface layer. For the etching effect, the hydrogen species chemically reacts with the constituents in the surface layer to form volatile species, such as hydrides, hydroxides, or water. In the etching process, some of the semiconductor material constituents, as well as oxygen, may be removed from the treated surface. For the reduction effect, the hydrogen species reacts with bonded oxygen in the native oxide to form a volatile species, such as water. In the latter process, the semiconductor material constituents remain intact, while oxygen is removed from the treated surface. Thus, in accordance with the process of the present invention, the native oxide layer is modified by the neutral hydrogen species to produce a chemically reduced form of the native oxide.

The neutral hydrogen species may be formed by the mercury sensitized photolysis of molecular hydrogen. As is known in the art of photochemistry, radiation at a wavelength of 2537 angstroms (Å) is absorbed by mercury vapor to produce mercury atoms in an excited state (Hg*), as indicated in equation (1) below. The Hg* atoms are approximately 5 electron volts above normal ground state, but unionized. The Hg* then interacts with the molecular hydrogen (H$_2$) and transfers energy to the hydrogen molecule to produce dissociation of H$_2$ into neutral atomic hydrogen as indicated in equation (2) below. It should be noted that mercury is used as a photosensitizer in conjunction with radiation at 2537 Å produced by a low pressure mercury vapor lamp. Similarly, other photosensitizers, such as cadmium, zinc, or xenon, may be used with radiation having a wavelength corresponding to the absorption wavelength for that element.

$$Hg + hc/\lambda(2537 \text{ Å}) \rightarrow Hg^* \quad (1)$$

where
h = Planck's constant
c = speed of light
λ = wavelength of absorbed radiation $$H_2 + Hg^* \rightarrow 2H + Hg \quad (2)$$

The term "neutral" is used herein to designate a species which has no electric charge associated with it. Alternatively, the neutral activated hydrogen species may be formed by the direct photolysis of molecular hydrogen by radiation having an appropriate wavelength, such as 1109 angstroms, which is absorbed by molecular hydrogen, and transfers sufficient energy to the hydrogen molecules to break the hydrogen-hydrogen bond, as schematically indicated in equation (3).

$$H_2 + hc/\lambda \rightarrow 2H \quad (3)$$

In an alternative embodiment of the present invention, the neutral hydrogen species may be excited molecular hydrogen (H$_2$*) which is formed by direct excitation of H$_2$ with radiation having an appropriate wavelength, such as 1002 angstroms, which is absorbed by the molecular hydrogen and transfers sufficient energy to the molecule to raise it to an excited state, as schematically indicated in equation (4).

$$H_2 + hc/\lambda \rightarrow H_2^* \quad (4)$$

Other hydrogen-containing precursors, such as methane and other alkanes, may be used provided that they are capable of being dissociated by radiation to form neutral hydrogen species, in a manner similar to that indicated above, and provided that they produce no deposition products themselves, as also indicated above.

The semiconductor substrate which is treated in accordance with the present invention may be formed of any material which is susceptible to native oxide formation. The term "native oxide" is used herein to designate an oxide formed by conversion of the top surface (approximately 10 to 100 angstroms) of the substrate to the corresponding oxide. Typical materials include mercury cadmium telluride (HgCdTe), gallium arsenide (GaAs), gallium aluminum arsenide (GaAlAs), indium phosphide (InP), indium antimonide (InSb), and germanium (Ge). The native oxide of GaAs, for example, comprises Ga$_2$O$_3$ and As$_2$O$_3$, while the native oxide of HgCdTe comprises a mixture of the oxides of Hg, Cd, and Te. In accordance with the process of the present invention, the neutral hydrogen species, generated as described above, interacts with the native oxide layer on the surface of the substrate to modify the layer in such a way as to reduce the oxygen content at the substrate surface.

An apparatus and method of use which are suitable for carrying out the above described process are set forth in U.S. Pat. No. 4,371,587, assigned to the present assignee. The operating pressure within the reaction chamber for the process of the present invention may be within the range of about 0.1 to 10 torr (13 to 1300 pascals). The pressure in the reaction chamber must be sufficiently low to provide an acceptable mean free path for the hydrogen species and an acceptable rate of reaction. The substrate temperature for the present process is determined by the thermal stability of the particular semiconductor material and is held below the temperature at which the particular material starts to decompose or degrade. For example, HgCdTe starts to decompose by volatilizing mercury at about 120° C., and consequently, HgCdTe substrates are treated in accordance with the present invention at a temperature of 100° C. or below. In practice, heat is not required to effect the chemical reduction reaction in the process of the present invention, and this process may be performed at temperatures as low as room temperature. However, higher temperatures may be advantageous in order to enhance the rate of the native oxide reduction reaction.

Thus, in accordance with the process of the present invention, there is provided a low-temperature process for treating a native oxide layer on the surface of a substrate at a temperature sufficiently low that thermal damage to the substrate is avoided. As previously discussed, thermal damage can result in decomposition of the substrate material. In addition, the higher temperatures required in some known methods of treating native oxide layers can produce boundary migration of predefined dopant regions in the substrate being treated. This latter problem is also avoided by the process of the present invention. In addition, the reducing species used in the process of the present invention is a neutral species which is generated by a benign photochemical process that produces no charged particles and no high energy radiation. Thus, charge bombardment and radiation bombardment of the substrate are avoided by the present invention. As previously noted, unwanted bombardment of the substrate surface by charged particles or radiation can alter the electrical properties at that surface to the extent that the performance of the final device formed from the substrate is degraded. Consequently, the process of the present invention enhances the electrical properties of the substrate surface and the final device.

It is particularly advantageous to perform the process of the present invention as an in-situ process which is followed by deposition of an insulator layer on the treated substrate surface, within the same reaction chamber. A preferred method for forming an oxide insulator layer is the photochemical vapor deposition process described in U.S. Pat. No. 4,371,587. Photochemical vapor deposition processes for depositing nitride and sulfide layers are described, respectively, in U.S. Pat. Nos. 4,181,751 and 4,447,469, both assigned to the present assignee. The composition of the insulator is chosen to provide the best insulation for the particular substrate material. Thus, the substrate is treated in accordance with the present invention to reduce the native oxide layer and enhance the electrical properties at the substrate surface. Then, the treated substrate is immediately exposed to the insulator-forming reactants in the same reaction chamber without breaking vacuum. By this in-situ sequence, exposure of the treated substrate surface to contamination is avoided or minimized and the electrical properties of the substrate surface are enhanced.

The following examples describe the process of the present invention in particular detail, as well as providing analyses of the products formed by this process.

EXAMPLE 1

A wafer of gallium arsenide was used as received from the supplier for the substrate to be treated, as Sample A shown in Table I. The wafer had a layer of native oxide formed on the surface thereof by exposure to the atmosphere. The substrate was placed in a photochemical vapor deposition apparatus of the general type described in U.S. Pat. No. 4,371,587 and the reaction chamber was evacuated to a pressure of about 1 millitorr (0.1 pascal). The substrate was heated to 150° C. Molecular hydrogen was passed over a pool of mercury, and the vapor mixture was introduced into the reaction chamber at a flow rate of 25 standard cubic centimeters per minute (sccm). Radiation having a wavelength of 2537 Å, produced by a mercury vapor lamp obtained from Canrad-Hanovia Inc. Of Newark, N.J., U.S.A., was introduced into the reaction chamber, and the reaction was allowed to proceed for 90 minutes at an operating pressure of about 1.0 torr (130 pascals). For Sample B, the above-described procedure was followed on a separate GaAs wafer with the reaction being conducted for 60 minutes at an operating pressure of 0.6 torr.

For each sample, the refractive index was measured by ellipsometry before and after the surface treatment, as summarized in Table I. The treated substrates showed a decrease in native oxide as evidenced by an increase in $\Delta$ and a decrease in $\Psi$, which are ellipsometric parameters related to index and thickness. These changes indicated a relative decrease in oxide thickness of about 20 Å per hour of treatment for each sample. As a control, an untreated GaAs sample was measured. It should also be noted that the measurements of Table I were made by removing the treated sample from the reaction chamber and then placing the sample in the ellipsometer. Consequently, some air oxidation of the treated surface may have occurred prior to the actual ellipsometric measurements, and may have resulted in the regrowth of some native oxide material which had been removed by the process of the present invention. Due to this air oxidation, the results of the surface treatment of the present invention to reduce the native oxide layer are probably better than those indicated in Table I. This latter problem can be avoided by making the ellipsometric measurements in-situ in the reaction chamber to avoid exposure to air subsequent to the surface treatment of the present invention.

TABLE I

ELLIPSOMETRY RESULTS FOR GaAs WAFER TREATMENT

| Sample | Before Treatment | | After Treatment | |
|---|---|---|---|---|
| | $\Delta$ | $\Psi$ | $\Delta$ | $\Psi$ |
| A | 157 | 11.15 | 166.0 | 10.6 |
| B | 158.2 | 11.0 | 166.7 | 10.7 |
| Control (typical range) | 156.8 to 157.6 | 11.0 to 11.15 | — | — |

Energy-dispersive analysis by X-rays (EDAX) was performed for bulk (i.e. a depth of about 1 micrometer) elemental characterizations of Samples A and B relative to two control samples. These analyses indicated no mercury contamination of the substrate by the above described treatment process. In each spectrum, the largest peak occurred near 1.6 KeV corresponding to overlapping Ga and As L-lines, and a broad, bell-shaped background peaked near 2.5 KeV corresponding to a Bremsstrahlung continuum. In every spectrum, a small peak (almost buried in the noise) near 1.8 KeV corresponded possibly to a Si K-line. This bulk quantity of Si was not surprising in that Si is nearly always present in epitaxially-grown GaAs. Two other peaks (almost buried in the noise) also occurred near 6.2 and 8.0 KeV corresponding respectively to Fe and Cu, both being artifacts of the EDAX system. There was no trace of any Hg in the spectra. Overall the EDAX spectra of the treated and control samples were very similar to each other, indicating that the composition of the bulk material of the substrate treated in accordance with the present invention was unchanged and had been uncontaminated by the treatment process.

Electron spectroscopy for chemical analysis (ESCA) was performed for surface (i.e. a depth of several atoms) elemental characterizations of Samples A and B and a control. The spectra were taken after the samples had been treated in accordance with the present invention to produce a light etch of less than 50 Å. Besides the usual presence of C and O probably from absorbed carbonaceous material, water, and oxide, the only elements detected were Ga and As. The elemental compositions of the surfaces are listed in Table II. The data for Sample A is identical to the Control within the 20 percent precision. The Ga/As atom ratio for Sample B is also identical to Sample A and the Control, although the O/Ga and C/Ga ratios for Sample B are greater than for Sample A. Nevertheless, the absolute amounts of C and O present on Sample B are quite low and could merely be artifacts of the ESCA system. There is no evidence of either Si with correlated lines at 102 and 152 eV or Hg with correlated lines at 100, 103, 359 and 379 eV. Overall the ESCA spectra of the treated and control samples were very similar.

In conclusion, there were no significant differences among the treated and control samples according to analyses of the EDAX results to a depth of one micrometer and ESCA results to a depth of about 100 angstroms. These results indicate that the process of the present invention is a near-surface reaction which does not affect the bulk material of the substrate. In addition, within the sensitivity limits of both EDAX and ESCA, no Si or Hg could be found that was attributable to the Hg-sensitized H-atom etch of GaAs or the reaction chamber. Further, as can be seen in Table II, the oxygen content of Sample A is significantly reduced as compared to the control, indicating conversion of the native oxide to a reduced form.

TABLE II

ESCA ELEMENTAL COMPOSITION OF TREATED GaAs WAFER

| Sample | Elements (atomic %) | | | | | | |
|---|---|---|---|---|---|---|---|
| | Ga | As | O | C | As/Ga | O/Ga | C/Ga |
| A | 47.0 | 35.0 | 9.1 | 9.3 | 0.75 | 0.19 | 0.20 |
| B | 40.0 | 28.0 | 18.0 | 15.0 | 0.70 | 0.45 | 0.38 |
| Control | 47.0 | 32.0 | 11.0 | 9.7 | 0.68 | 0.23 | 0.21 |

EXAMPLE 2

Mercury cadmium telluride substrates were treated as follows prior to treatment in accordance with the process of the present invention, as summarized in Table III:

a. For Sample D, the wafer was chemically etched and polished to remove any pre-existing native oxide, as is known in the art.

b. For Sample E, the wafer was oxidized by a known wet chemical anodization process in which the wafer is made the anode in an electrolytic cell and a current in passed through a selected electrolyte to form the native oxide layer.

c. For Sample F, the wafer was exposed to the atmosphere to effect oxidation.

d. For Sample G, the wafer was oxidized by a known plasma process in which an oxygen plasma is formed by the action of an electric field and the oxygen plasma oxidizes the wafer surface to form the oxide.

Each sample was treated in accordance with the process of the present invention as generally described in Example 1. The hydrogen source comprised a mixture of 15 percent $H_2$ and 85 percent $N_2$ at a flow rate of 10 sccm. The substrate temperature was 100° C. and the reaction was conducted for 20 minutes. The operating pressure was 950 millitorr (130 pascals) except for the samples noted in Table III.

The samples were analyzed by ellipsometry both before and after treatment in accordance with the present invention, to determine film thickness (t) and refractive index (n) with the test results being indicated in Table III. Because the native oxides are thin, the uncertainty in refractive index is relatively large. Significant changes in film thickness were observed for all HgCdTe samples regardless of the operating pressure or the type of native oxide existing prior to photochemical surface treatment. Sample E, which was anodized prior to surface treatment, lost about 150 Å apparently due to etching by the atomic hydrogen. All other HgCdTe samples, however, exhibited increases in film thickness upon surface treatment if transparent, homogeneous dielectrics are assumed. One possible explanation for this observation is the growth of a native oxide layer due to residual oxygen in the reaction chamber, possibly in the form of water on the chamber walls. More likely, however, in view of the ESCA results, the atomic hydrogen may actually roughen the substrate surface such that voids simulate an apparent film thickness. Other interpretations of the ellipsometric data, of course, may be possible where non-transparent or inhomogeneous films are assumed. The main result is that the surfaces are significantly modified by treatment in accordance with the process of the present invention.

For comparison purposes, a "bare" silicon wafer with a native oxide layer approximately 30 angstroms thick and a silicon wafer having a photo-oxide layer deposited thereon by the process of U.S. Pat. No. 4,371,587 were treated in accordance with the above described process of the present invention. These latter two wafers did not experience any significant changes in ellipsometric parameters after surface treatment and exposure to air for measurements. These results indicate that, in the present process, there is a reaction only with the HgCdTe surface and that there is no film deposition by chemical vapor deposition processes.

TABLE III

ELLIPSOMETRY TEST RESULTS FOR HgCdTe WAFER TREATMENT

| | | Ellipsometry Results | | | |
|---|---|---|---|---|---|
| | | Before Treatment | | After Treatment | |
| Sample | Native Oxide Type | t** | n | t** | n |
| D | Plasma | 52Å | 2.42 | 121Å | 2.92 |
| E | Anodic | 684Å | 2.20 | 528Å | 1.98 |
| F | "Bare" Surface (Atmospheric) | <10Å | — | 148Å | 2.68 |
| G* | Plasma | 48Å | 2.13 | 140Å | 2.41 |
| H* | "Bare" Surface (Atmospheric) | <10Å | — | 139Å | 2.51 |
| I* | "Bare" Surface (Atmospheric) | <10Å | — | 141Å | 2.42 |

*Operating pressure for photochemical surface treatment was about 0.1 torr (13 pascals).
**Estimated from changes in Δ and Ψ, assuming transparent homogeneous dielectric films.

ESCA was performed on three of the above-noted samples both before and after treatment in accordance with the process of the present invention, with the results regarding surface composition to a depth of about 50 angstroms being summarized in Table IV. Samples J and K had native oxides grown on the surface prior to surface treatment, while Sample L was chemically cleaned to strip off any pre-existing native oxide. High resolution data from the C (1s) spectrum were used to determine the atom percent of oxygen present on the sample surface, bound to carbon. It is assumed that oxygen not bound to carbon is bound to metals. The typical 35 percent carbon content which resides as a surface film of organic contamination is not included in Table IV. The distribution of oxidized and reduced Te is calculated from both the Te (3d) and Te (d) lines as listed in Table IV.

The distribution of metals on the surface after receiving the atomic hydrogen treatment is very different from that before the treatment. In particular, these samples had a greater percentage of Cd on the surface and a reduced percentage of Hg. In addition, the amount of oxidized Te present was significantly less after the atomic hydrogen treatment than before the treatment. This indicates that the native oxide layer was reduced to some extent. Further, the significant reduction in the oxygen content as shown in Table IV after treatment of the wafer shows that the native oxide layer has been converted to a reduced state.

TABLE IV

ESCA ELEMENTAL COMPOSITION OF HgCdTe WAFERS

| Sample | Surface Condition | H-atom Treatment | Hg | Cd | Te (ox) | Te (red) | O |
|---|---|---|---|---|---|---|---|
| J | Plasma native oxide | Before | 17 | 5.4 | 21 | 2.5 | 54 |
|   |   | After | 5.0 | 38 | 7.9–11 | 16–19 | 30 |
| K | Anodic native oxide | Before | 12 | 16 | 17 | 0 | 55 |
|   |   | After | 1.9 | 67 | 0.5–1.9 | 22–23 | 5.4–8.1 |
| L | Bare surface (Br polish) | Before | 23 | 4.8 | 18 | 15 | 39 |
|   |   | After | 6.5 | 56 | 5.6–7.7 | 14–16 | 13–19 |

*Normalized with respect to Hg, Cd, Te and O.

EXAMPLE 3

This example illustrates the sequential in-situ surface treatment of a substrate followed by deposition of an oxide insulator layer.

The surface of a HgCdTe substrate was treated in accordance with the process of the present invention as described in Example 2. A pure $N_2$ purge was performed after atomic hydrogen treatment to remove any residual $H_2$ from the reaction chamber. Then a layer of $SiO_2$ was deposited by the photochemical vapor deposition process described in U.S. Pat. No. 4,371,587 using silane and the mercury-sensitized dissociation of nitrous oxide. The deposition process was conducted in-situ for 20 minutes to provide a 1500 Å thick layer of $SiO_2$. After deposition of the $SiO_2$, the samples were dot metallized in a metal evaporator system for subsequent electrical testing of the metal-insulator-semiconductor (MIS) structures.

Capacitance-voltage (C-V) curves were collected at 77° K. between −14 and +12 volts gate bias. The C-V curves for five different MIS capacitors on the same HgCdTe wafers exhibited non-ideal behavior, specifically, thermal generation of charge carriers in the inversion region between 0 and −14 volts. In addition, a significant amount of hysteresis due to charge injection was indicated. This result was in contrast to results obtained on HgCdTe/Photo-oxide MIS structures without the photochemical atomic hydrogen treatment, which show nearly ideal C-V characteristics. A possible explanation for this result is that a native oxide layer on a HgCdTe substrate may be necessary in order to provide good C-V characteristics. Another explanation for this result is that surface roughness may increase the surface area, simulating a higher density of states. In fact, some fraction of the surface may not be in intimate contact with the deposited insulator, resulting in unsatisfied chemical bonds. Thus, when the native oxide layer is removed by the process of the present invention, the C-V characteristics are degraded. However, these results provide further indication that the native oxide layer is altered by the process of the present invention.

EXAMPLE 4

An indium phosphide substrate was treated in accordance with the process of the present invention as generally described in Example 2. The $H_2/N_2$ mixture was flowed over the InP substrate surface at a rate of 20 sccm and total pressure of 160 millitorr (0.2 pascals). The substrate temperature was 100° C. After 5 minutes exposure to the photogenerated atomic hydrogen, the system was purged with nitrogen. Then, a 1000 Å layer of photo-oxide was deposited in 20 minutes by the process described in Example 3, without breaking vacuum prior to deposition. Consequently, any native oxide reduction which occurred during the atomic hydrogen treatment was preserved as much as possible under the existing vacuum conditions, at the time of $SiO_2$ deposition. The semiconductor/insulator interface characteristics were evaluated by C-V analysis of MIS structures. C-V curves were collected at room temperature between +5 and −5 volts gate bias, at 100 KHz, 1 MHz, and 10 MHz. Compared to InP/Photo-oxide MIS structures without the photochemical atomic hydrogen treatment, the results indicated a degradation in the C-V characteristics. As discussed with regard to example 3, these results indicate that definite changes in the interface occur upon atomic hydrogen treatment in accordance with the process of the present invention.

EXAMPLE 5

A germanium substrate was treated as described in Example 4 for an indium phosphide substrate. MIS structures were fabricated and subsequently analyzed by C-V plotting. Typical C-V curves for these MIS structures indicated poor C-V characteristics, which were similar to the results for a control wafer which was not subjected to atomic hydrogen treatment. It is known that the native oxide of germanium is undesirable due to its hygroscopic nature and degrades the C-V characteristics. However, it appears that the absence of this native oxide, as produced by the process of the present invention, degrades the C-V characteristics even further.

Having thus described exemplary embodiments of the present invention, it should be noted by those skilled in the art that the disclosures within are exemplary only and that various other alternatives, adaptations, and modifications may be made within the scope of the present invention. Accordingly, the present invention is not limited to the specific embodiments as illustrated herein. In particular, the process of the present invention may be practiced on substrates of semiconductor materials other than those specifically described in the examples herein and may be optimized for each type of material by evaluation of experimental results and refinement of process parameters.

What is claimed is:

1. A low-temperature, charge-free process for treating a semiconductor substrate having a native oxide layer formed on the surface thereof, comprising exposing said substrate at a temperature within the range of about 30° to 200° C. to a chosen vapor phase hydrogen-containing precursor capable of being dissociated by radiation of a predetermined wavelength in the presence of radiation of said predetermined wavelength to form neutral hydrogen species sufficient to react with said native oxide and convert said native oxide to a chemically reduced form while simultaneously avoiding thermal damage and charge damage to said substrate.

2. The process of claim 1 wherein said neutral hydrogen species is selected from the group consisting of atomic hydrogen and excited molecular hydrogen.

3. The process of claim 1 wherein said chosen hydrogen-containing precursor is molecular hydrogen.

4. The process of claim 1 wherein said exposing occurs in the presence of a photosensitizer.

5. The process of claim 4 wherein said photosensitizer comprises mercury vapors and said predetermined wavelength of said radiation is 2537 angstroms.

6. The process of claim 1 wherein said semiconductor substrate comprises a material selected from the group consisting of mercury cadmium telluride, gallium arsenide, indium phosphide, and germanium.

7. The process of claim 1 wherein said predetermined wavelength of said radiation is 1109 angstroms.

8. The process of claim 1 which further includes, after exposing said native oxide layer to said hydrogen species to provide a treated substrate surface, exposing said treated substrate surface in-situ to chosen vapor phase reactants in the presence of radiation of a predetermined wavelength to bring about a reaction between said vapor phase reactants to form a chosen insulator material which deposits on said treated substrate surface to thereby provide a device having enhanced electrical properties at the interface between said substrate surface and said insulator layer.

9. The process of claim 8 wherein:
(a) said substrate comprises mercury cadmium telluride; and
(b) said insulator layer comprises silicon dioxide.

* * * * *